(12) United States Patent
Englisch

(10) Patent No.: US 6,660,540 B2
(45) Date of Patent: Dec. 9, 2003

(54) TEST WAFER AND METHOD FOR INVESTIGATING ELECTROSTATIC DISCHARGE INDUCED WAFER DEFECTS

(75) Inventor: Andreas Englisch, Hamburg (DE)

(73) Assignee: DuPont Photomasks, Inc., Round Rock, TX (US)

( * ) Notice: Subject to any disclaimer, the term of this patent is extended or adjusted under 35 U.S.C. 154(b) by 0 days.

(21) Appl. No.: 10/071,167

(22) Filed: Feb. 8, 2002

(65) Prior Publication Data

US 2002/0076840 A1 Jun. 20, 2002

Related U.S. Application Data

(63) Continuation-in-part of application No. 09/545,145, filed on Apr. 7, 2000, now Pat. No. 6,376,264.
(60) Provisional application No. 60/128,537, filed on Apr. 9, 1999.

(51) Int. Cl.$^7$ ........................... H01L 21/66; H01L 23/58
(52) U.S. Cl. ............................. 438/14; 257/48
(58) Field of Search ............... 438/14, 16, 17; 257/48

(56) References Cited

U.S. PATENT DOCUMENTS

| | | | |
|---|---|---|---|
| 4,440,841 A | 4/1984 | Tabuchi | 430/5 |
| 4,758,094 A | 7/1988 | Wihl et al. | |
| 5,212,541 A | 5/1993 | Bergemont | |
| 5,675,260 A | 10/1997 | Consiglio | 324/763 |
| 5,796,256 A | * 8/1998 | Fowler et al. | 324/456 |
| 5,835,327 A | 11/1998 | Siew et al. | 361/111 |
| 5,858,580 A | 1/1999 | Wang et al. | 430/5 |
| 5,989,754 A | 11/1999 | Chen et al. | |
| 6,118,419 A | 9/2000 | Smith et al. | 345/84 |
| 6,396,255 B2 | 5/2002 | Karins et al. | 324/96 |

FOREIGN PATENT DOCUMENTS

JP             11002893 A     1/1999

OTHER PUBLICATIONS

Press Release, "Two New Products Help Monitor Reticle Quality from Final Manufacturing Inspection Through Photolithography Re–Qualification",—KLA–Tencor Corporation, Mar. 19, 1998.
Wiley & Steinman, "Ultrapure Materials–Reticles: Investigating a New Generation of ESD–Induced Reticle Defects", micromagazine.com, Canon Communication LLC., p. 35, Apr. 1999.
Photronics, Inc., "Photomask Basics", Printed Mar. 24, 1999, <http://www.photronics.com/internet/corpcomm/publications/basics101/basics/htm>.
PCT Search Report PCT/US 00/09233, Aug. 10, 2000.
IBM Technical Disclosure Bulletin, "*Electrostatic Discharge Monitor*", IBM Corp. New York, vol. 30, No. 5, Oct. 1, 1987.
PCT Written Opinion PCT/US 00/09233, Mailed Aug. 3, 2001.
Alpay, et al., *Film Stress and Geometry Effects in Chrome Photomask Cleaning Damage*. SPIE vol. 3236, pp. 76–81, Sep. 19, 1997.
Japanese Patent (Abstract) 11002893, Jan. 6, 1999.
J. Montoya et al., "A Study of the Mechanisms for ESD Damage to Reticles," Apr. 2001, Electronics Packaging Manufacturing, IEEE 12 Pages.
PCT International Search Report PCT/US03/01117 5 pages. Jul. 2, 2003.

* cited by examiner

*Primary Examiner*—Evan Pert
(74) *Attorney, Agent, or Firm*—Baker Botts L.L.P.

(57) ABSTRACT

A test wafer and method for investigating electrostatic discharge induced wafer defects are disclosed. The test wafer includes an electrostatic discharge (ESD) sensitive risk scale geometry, formed thereon. After exposure to a semiconductor manufacturing procedure, the test wafer may be analyzed by using the ESD risk scale geometry to identify and evaluate severity of any ESD effects associated with the semiconductor manufacturing procedure.

28 Claims, 4 Drawing Sheets

TEST WAFER AND METHOD FOR INVESTIGATING ELECTROSTATIC DISCHARGE INDUCED WAFER DEFECTS

CROSS-REFERENCE TO RELATED APPLICATIONS

This application is a continuation-in-part from U.S. application Ser. No. 09/545,145, filed by Andreas Englisch on Apr. 7, 2000, entitled, "Test Photomask And Method For Investigating ESD-Induced Reticle Defects" now U.S. Pat. No. 6,376,264 that claims the benefit of U.S. Provisional Application Ser. No. 60/128,537 filed Apr. 9, 1999, and entitled "Method And Apparatus for Monitoring Electrostatic Discharge Effects.

TECHNICAL FIELD OF THE INVENTION

This invention relates in general to the field of semiconductor manufacturing and, more particularly, to a test wafer and method for monitoring electrostatic discharge induced wafer defects.

BACKGROUND OF THE INVENTION

Over the past several years, the development of electronic devices such as laptop computers, hand held computers, personal data assistants (PDA) and global telephones has resulted in an increased demand for smaller semiconductor integrated circuits (IC) and associated electronic components. In order to meet this demand, manufactures have developed several techniques to reduce the overall size and dimensions of an electrical component. Specifically, some of these techniques are aimed at circuit geometries that include smaller and more dense electrical components.

The manufacturing of complex semiconductor devices involves a series of processes including deposition, inspection, photolithography, etching, and testing. During the photolithographic process, semiconductor manufacturers use a photomask to copy an image of an electronic circuit on to a semiconductor wafer. Photomasks generally include a transparent substrate having a patterned metal layer (e.g., chrome) deposited on one surface. This patterned metal layer contains the microscopic image of the electrical circuit, which may be referred to as the photomask's geometry.

Ideally, the patterning process creates exact replicas of the desired electrical circuit on the wafer. However, there are several factors which affect the quality of the geometry, including any electrical parameters. The quality of the geometry created on the wafer, as well as electrical parameters of the various layers that form the geometry, will substantially dictate the quality of the electronic circuits. As design rules have moved toward smaller and more dense IC devices, the integrity of the geometry, and the associated electrical parameters have become increasingly important.

One key cause of geometry degradation is electrostatic discharge (ESD). ESD is created when a force causes a charge imbalance between conductive features on a semiconductor wafer. In the semiconductor context, effects of ESD include material sputtering and material migration. Instances of these effects can result in the non-functioning of IC devices created from a degraded semiconductor wafer. As such, an incentive exists for identifying problem wafers and potential sources of ESD. Unfortunately, given the large number of process steps necessary to create a large scale IC device, it is often very difficult to identify and monitor ESD effects throughout the complete manufacturing process. This is especially true when wafer production, handling, storage and cleaning are included in the list of semiconductor manufacturing process steps.

One conventional method of testing for ESD damage on wafer is a functionality test. Typically, ESD damage on a semiconductor wafer attacks the functionality of a single transistor in an IC device. Functionality testing for ESD damage is performed at the end of the manufacturing process by using s completed electrical circuit on the semiconductor wafer. Electrical measurements are taken to test the circuit pathways to determine possible ESD damage. The functional test, however, retroactively identifies potential ESD effects because the test uses a completed semiconductor IC.

While a defect inspection is another conventional method of testing, this technique typically focuses more on the photomask used to create the image on the wafer. Defect inspection may include either a die-to-die inspection or die-to-database inspection. In either case, an actual photomask geometry is compared to an ideal photomask geometry. Differences between the actual and the ideal are identified and a determination as to defect severity is made. Typically, the inspection may include a performance check of different resist structures, which have been created during a photolithography process or may appear following an etching step. Again, the inspection technique is retroactive since it identifies defective dies after they have been damaged. Furthermore, the method is difficult to apply to wafers because of the number of different electrical patterned layers that may be incorporated on the semiconductor IC. Moreover, the inspection method requires a costly device that is capable of comparing the actual geometry with the ideal geometry.

A further inspection method includes taking electrical field strength measurements at various steps during a semiconductor manufacturing process. This method is problematic for at least two reasons. First, electrical field strength measurements are not ESD measurements. The strength of an electrical field is merely an indicator of ESD potential. And second, the measurement is merely an indication of the ESD potential associated with a particular process. The ESD effects induced during the particular process may be only one component of the total ESD effects that a typical wafer encounters.

SUMMARY OF THE INVENTION

In accordance with teachings of the present invention, the disadvantages and problems associated with testing for and investigating electrostatic discharge (ESD) induced wafer defects have been substantially reduced or eliminated. In a particular embodiment, a method for investigating ESD induced wafer defects is disclosed that includes analyzing a test wafer using an ESD sensitive risk scale geometry to identify and evaluate severity of electrostatic discharge effects associated with a semiconductor manufacturing procedure.

In accordance with one embodiment of the present invention, a method for investigating ESD induced wafer defects includes exposing a test wafer that includes an ESD sensitive risk scale geometry to a semiconductor manufacturing process and analyzing the test wafer using the risk scale geometry to identify and evaluate severity of ESD effects associated with the manufacturing process. The test wafer, which contains an ESD sensitive geometry, is exposed to one or more semiconductor manufacturing processes. After exposure, the test wafer may be analyzed using the risk scale geometry to determine how much, if any, degradation of the geometry has occurred as a result of the exposure.

In accordance with another embodiment of the present invention, a method for monitoring severity of ESD effects includes contacting a test wafer having an ESD sensitive risk scale geometry with a piece of semiconductor manufacturing equipment. The wafer may then be removed from the piece of semiconductor manufacturing equipment. The ESD sensitive geometry on the wafer is analyzed using the risk scale geometry to determine severity of degradation, if any, of the geometry that occurred as a result of contact with the semiconductor manufacturing equipment.

In accordance with a further embodiment of the present invention, an apparatus for investigating ESD induced wafer defects includes a wafer that includes a plurality of test modules which define a risk scale. The plurality of test modules includes ESD sensitive geometry formed on the wafer defined in part by bodies with sufficient surface area to induce ESD effects. The geometry may include a line and a gap disposed between the bodies. In one particular embodiment, the apparatus may be formed from a string of test modules that are arranged such that the line associated with a first module extends towards the body associated with a second module.

Important technical advantages of certain embodiments of the present invention include an ESD sensitive geometry formed on a test wafer. The ESD sensitive geometry includes a body feature sufficient to induce an ESD effect with a line extending towards a second body feature and a gap formed between the line and the second body. The ESD sensitive geometry allows the test wafer to reveal ESD effects in one or more cycles of exposure to a given manufacturing procedure or manufacturing device.

Another important technical advantage of certain embodiments of the present invention includes an ESD sensitive geometry that corresponds to one or more design rules in a semiconductor manufacturing process. A design rule sets minimum allowable feature sizes for electrical circuits used to create an IC device. The ability of the ESD sensitive geometry to relate to multiple design rules allows a manufacturer to quickly determine what design rule can consistently be used with the existing manufacturing tools to manufacture the IC device.

A further technical advantage of certain embodiments of the present invention includes an ESD risk scale geometry that allows users to identify, monitor and evaluate a single process step (e.g., photolithography, cleaning, etc.) in a semiconductor manufacturing process. Alternatively, the user may identify, monitor and evaluate the entire semiconductor manufacturing process and associated wafer handling procedures for cumulative ESD effects. The user, therefore, may quickly identify ESD problem areas in the semiconductor manufacturing process.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete understanding of the present invention and advantages thereof may be acquired by referring to the following descriptions taken in conjunction with the accompanying drawings, in which like reference numbers indicate like features, and wherein.

DETAILED DESCRIPTION OF THE INVENTION

Preferred embodiments of the present invention and their advantages are best understood by references to FIGS. 1 through 4, where like numbers are used to indicate like and corresponding parts.

Figures 1A, 1B, 1C:
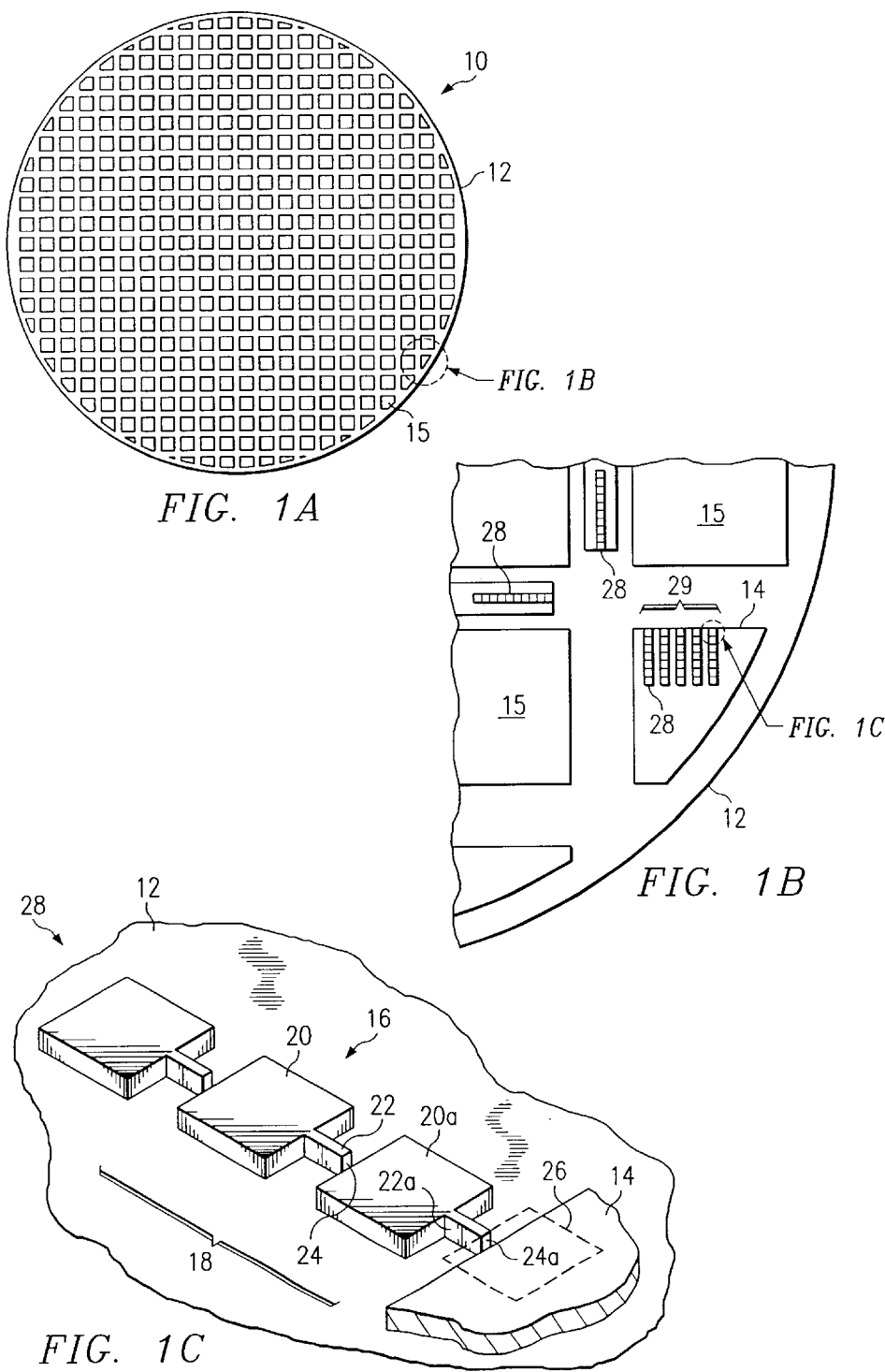
FIG. 1A illustrates a perspective view of one embodiment of an apparatus for monitoring and evaluating severity of electrostatic discharge effects in accordance with the teachings of the present invention.
FIGS. 1B and 1C illustrate enlarged perspective views of one embodiment of an apparatus for monitoring and evaluating severity of electrostatic discharge effects in accordance with the teachings of the present invention.

FIGS. 1A, 1B, and 1C illustrate perspective views of one embodiment of an apparatus, indicated generally at 10, for monitoring and evaluating severity of electrostatic discharge (ESD) effects. In the illustrated embodiment, apparatus 10 is a semiconductor wafer. Apparatus 10 may be any variety of semiconductor wafer types, including, but not limited to, a single or double sided polished wafer, a one inch to a twelve inch wafer, a bonded wafer, a doped wafer, a silicon germanium wafer, or any other type of wafer suitable for use in a semiconductor process. Apparatus 10 includes active area 15 and substrate 12. Substrate 12 may be made from materials including, but not limited to, quartz, silicon or silicon germanium. Active area 15 is typically formed from a conductive metal layer, such as copper, aluminum or any other conductive material. In an alternative embodiment, the conductive metal layer is isolated from substrate 12 or other conductive layers previously deposited on the wafer by an insulating layer.

In one particular embodiment, ESD sensitive geometry 16 is formed on apparatus 10 from the conductive layer placed on substrate 12. As shown in FIG. 1B, ESD sensitive geometry 16 may be formed in a number of ways on apparatus 10. For example, ESD sensitive geometry 16 can be etched into a conductive layer either within active area 15 or placed in the non-active areas, such as near an alignment mark (not expressly shown) located in the scribe lines.

In another embodiment, apparatus 10 includes an ESD test wafer that has ESD sensitive geometry 16 formed on the wafer. For example, the ESD test wafer may be a chrome on quartz wafer manufactured by Hoya Corporation or a silicon wafer coated with an oxide layer for isolation and a structured metal layer formed on the oxide layer. The ESD test wafer may be used as a specific test and diagnostic wafer. Typically, ESD sensitive geometry 16 is the only feature formed on the ESD test wafer.

ESD sensitive geometry 16 may include test module pattern 18 and border 14, formed on a surface of apparatus 10. As shown in FIG. 1C, test module pattern 18 includes bodies 20 and 20a, border body 26, lines 22 and 22a, and gaps 24 and 24a. It should be noted that border body 26 comprises a portion of border 14. The quantity, configuration and size of test module pattern 18 may be varied to monitor, evaluate, and scale ESD and ESD effects.

Although a test wafer having ESD sensitive geometry 16 may have various dimensions, the embodiment represented by apparatus 10 is a round test wafer that includes test module string 28. As shown in FIG. 1B, test module string 28 may include one string or five strings. An example five string group 29 may be seen more clearly in FIG. 2. Although FIGS. 1A, 1B, 1C and 2 illustrate a single five string group 29, the number of strings within a group and the number of groups on a wafer may be varied.

In addition to varying the number of groups and/or strings within a group, the dimensions of a test module, such as the elements depicted in test module pattern 18, may be varied. For example, body 20 may be a generally square structure with dimensions of approximately 250 micron ($\mu$m) by 250 $\mu$m, line 22 may have a length of approximately 40 $\mu$m and a width of approximately 0.25 $\mu$m, and gap 24 defined by the distance between line 22 and body 20a may have a width of approximately 0.25 $\mu$m. All of these dimensions may be varied in order to improve ESD testing for a given semiconductor manufacturing process and a desired design rule.

It should be noted that a single test wafer may include multiple instances of test module pattern 18 and that the various instances of test module pattern 18 could have bodies 20, lines 22 and gaps 24 of differing dimensions. By placing the end of one test module pattern 18 next to the beginning of another test module pattern 18, test module string 28 may be formed. In fact, test module string 28 may be more sensitive to ESD effects than single test module pattern 18 alone. As such, it may be desirable to create a group of test module strings that include between five and twenty-five instances of test module string 28 extending from border 14. In one embodiment, test module string 28 may be formed with a constant gap 24 dimension for each test module pattern 18. In an alternate embodiment, gap 24 dimension varies with each test module pattern 18 to form test module string 28.

Because a single test wafer could include several instances of test module string 28 or even several groups of test module string 28, body 20, line 22 and gap 24 dimensions could be varied among and/or within test module string 28 to provide specific ESD testing for a semiconductor manufacturing process. In one embodiment, six sets of five string group 29, with each test module string 28 including twenty-five test module pattern 18, could be included in ESD sensitive geometry 16.

Figure 2:
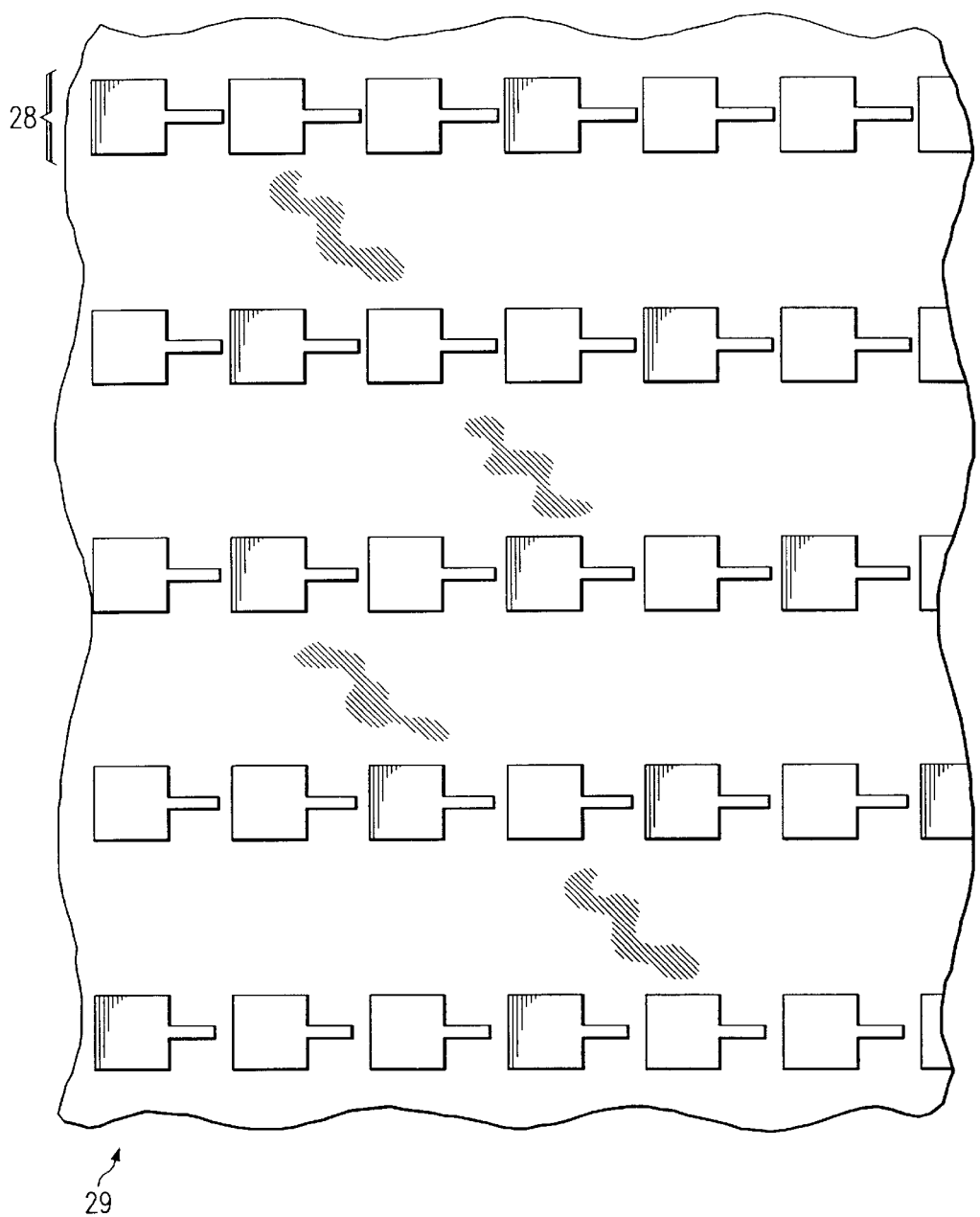
FIG. 2 illustrates a top view of another embodiment of an apparatus for monitoring and evaluating severity of electrostatic discharge in accordance with the teachings of the present invention.

FIG. 2 illustrates a top view of another embodiment of apparatus 10 for monitoring and evaluating severity of ESD. Each instance of test module string 28 in five string group 29 may be substantially identical in order to provide multiple locations for ESD incidents. Additionally, these identical string groups may provide statistically relevant results for predicting and monitoring ESD effects.

Moreover, test module pattern 18, as illustrated in FIG. 1C, may be distributed to cover all portions of the testing surface. If test module pattern 18 covers all portions of a testing surface, several locations on the wafer may be tested independently from each other which may allow, for example, the testing of individual grounding pads on a photolithographic tool or any other local ESD variation. The accuracy of ground pad testing may be improved by spacing one instance of test module string 28 approximately one millimeter apart from another instance of test module string 28.

Multiple sets of test module string 28 also allow for monitoring and evaluating several possible ESD events at the same time. By varying gap 24 and/or line 22 dimensions between instances of test module string 28 that form five string group 29, the critical dimensions for circuit features and associated design rules may be defined. By including gap 24 dimensions of 0.15 $\mu$m, 0.20 $\mu$m, 0.25 $\mu$m. 0.30 $\mu$m and 0.40 $\mu$m and using line 22 width of 0.25 $\mu$m, a semiconductor manufacturer will be able to test manufacturing processes to determine which design rule the manufacturer could effectively manufacture with existing tools. If the test wafer indicates failures at sites with gap 24 width of 0.15 $\mu$m and line 22 width of 0.25 $\mu$m, the manufacturer may predict that a related design rule, such as 0.15 $\mu$m, may suffer from ESD and may not be manufactured with the existing tools or procedures. Conversely, if the test wafer indicates no failures at sites with gap 24 width of 0.25 $\mu$m and line 22 width of 0.25 $\mu$m, the manufacturer may manufacture to a related design rule, such as 0.25 $\mu$m, without being damaged by ESD effects indicated by the test wafer.

Determining whether a test wafer indicates a failure may involve two primary steps: (1) exposing the test wafer to a charge inducing event or tool, which can include handling, cleaning, storing or grounding of the test wafer; and (2) analyzing the test wafer to determine the severity of geometry degradation, which also may indicate the severity of any ESD effects. The exposing step can include exposure to a single event or tool, or exposure to a series of events and/or tools.

The analyzing step may include the use of a microscope. By using a microscope, results indicating the severity of the ESD effects may be determined quickly and at a relatively low cost. The analysis, however, would most likely be performed by a human using the microscope, which could lead to accuracy and subjectivity problems due to human error. In another embodiment, the analysis of the effects of ESD may be performed by an inspection test. Inspection testing may be an automated testing procedure that indicates differences in optical behavior of the test pattern and particularly the material that makes up the test pattern geometry. For example, an inspection test may be performed by an optical inspection device such as a microscope (e.g., a scanning electron microscope or an atomic force microscope).

Another analyzing step may include etching an additional instance of test module pattern 18 on the wafer throughout the manufacturing process. By adding more ESD sensitive geometry 16 features, an analyzing technique may provide information concerning high ESD problem areas of the manufacturing process. Additionally, an analyzing technique may include the comparison of test module pattern 18 to show the cumulative effects of ESD throughout the manufacturing process.

Figure 3:
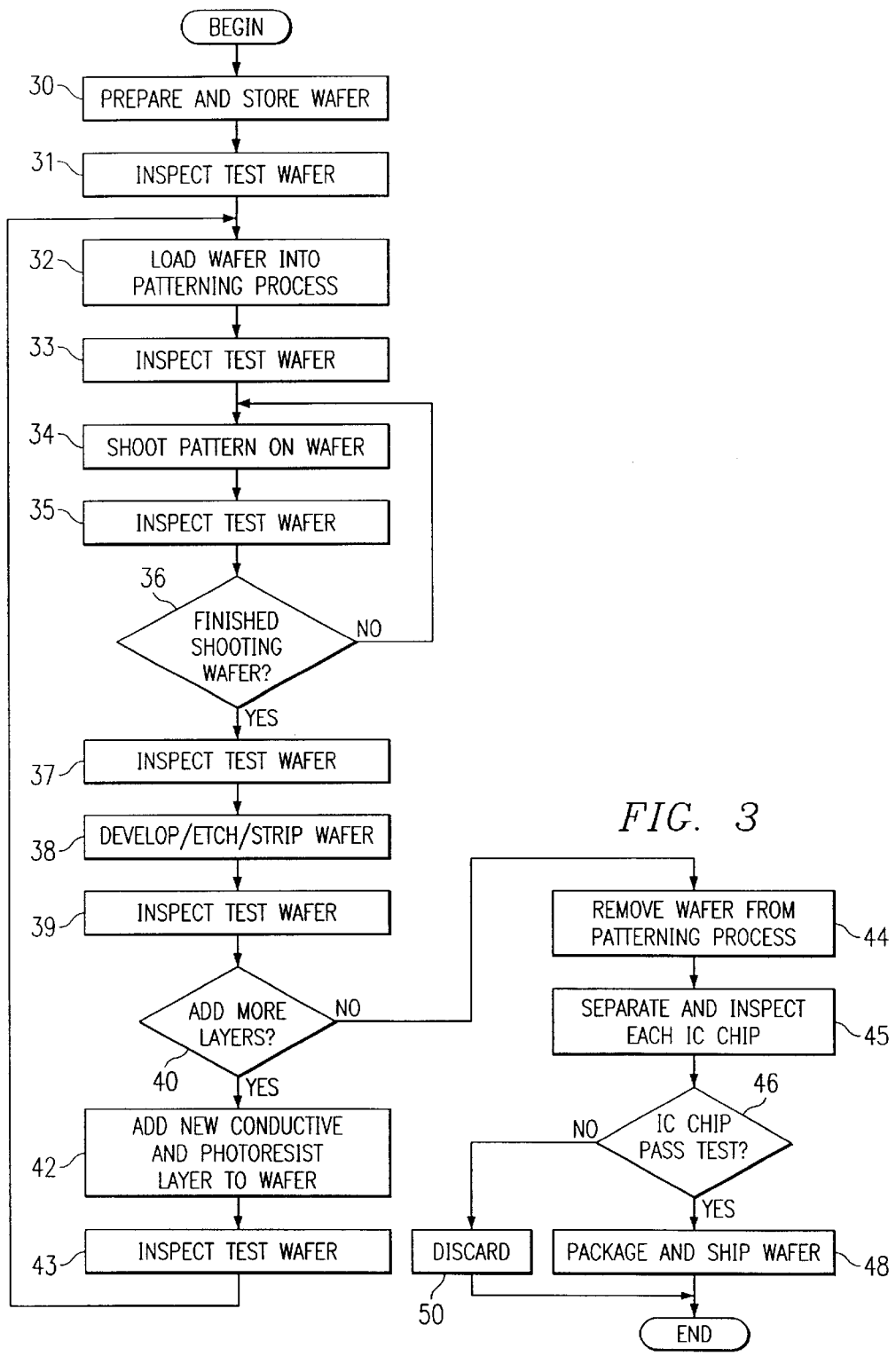
FIG. 3 illustrates a flow chart of a method for identifying potential sources of electrostatic discharge effects in a semiconductor manufacturing process in accordance with the teachings of the present invention.

FIG. 3 illustrates a flow chart of a method identifying potential sources of ESD in a semiconductor manufacturing process. A typical semiconductor manufacturing procedure may include wafer manufacturing steps, photolithography steps and IC device manufacturing steps. Many of the steps associated with the manufacturing of wafers, photolithographic devices and IC devices are potential sources of ESD and, as such, potential causes of photomask geometry degradation.

At step 30, a potential source for ESD exists when the wafer is prepared and stored prior to the photolithographic process. Despite the lack of structures or geometry on the wafer, an electrical potential may develop on the wafer itself. By placing a test wafer with ESD sensitive geometry 16 with the other wafers, the test wafer may be inspected to detect ESD potential during the storage and handling of the wafers at step 31. The test wafer may include a wafer with only the ESD geometry formed on the wafer (i.e., an ESD test wafer) or a production wafer with an electrical circuit pattern and the ESD geometry formed on the wafer. At step 32, the wafer is loaded into a patterning process which forms the electrical circuit pattern on the wafer. This process may involve several handling stages and association with different types of equipment, such as photolithographic tools and devices, including grounding of the wafer. Each of these handling stages either alone or in combination may create an ESD potential that can harm the wafer.

At step 33, the test wafer may be removed from the photolithographic tool or device for inspection to detect and identify any ESD effects. Once the wafer is loaded into a device or tool, the wafer experiences a high ESD potential during imaging of the electrical pattern onto the wafer at step 34. Certain test wafers may be removed from the photolithographic tool or device for inspection at step 35. These test wafers may predict a failure of the wafer because of damage caused by ESD effects. At step 36, the photolithographic tool either continues to shoot patterns on the wafer (e.g., a stepper moving to a new location on the wafer) or finishes the patterned layer to proceed with developing of the wafer. However, if the wafer has completed the patterning of this layer, the wafer needs to be developed.

Prior to developing the wafer, the test wafer may inspected for both cumulative and individual effects of ESD at step 37. At step 38, the wafer is developed to reveal the electrical pattern, etched to form the pattern in the conductive metal layer and then stripped to remove the remaining photoresist layer. While each of these procedures may include various handling stages and numerous equipment or tools that may expose the wafer to ESD effects, the test wafer may be inspected after each procedure or following the stripping procedure to detect the cumulative potential of ESD effects at step 39. Because the developing and etching of the wafer transfers the electrical pathways into the conductive layer, an ESD potential may exist. Following etching, the remaining photoresist layer may be removed from the wafer in a stripping procedure. Because this procedure may include several steps, it can be another source of ESD.

At step 40, an electrical pattern has been formed on the wafer and the wafer either returns to the patterning process for additional layers or proceeds to step 44. If the wafer is returned for additional pattern layers, a new conductive layer and photoresist layer is placed over the existing pattern(s) on the wafer at step 42. Because the addition of these layers includes various handling steps and is loaded into different tools or devices, the test wafer may be inspected to detect for ESD potential at step 43. The wafer returns to the patterning process at step 32. However, if the electrical pattern on the wafer is complete, the wafer is removed from the patterning process at step 44. As such, many ESD effects may be observed when the wafer is removed from a photolithographic tool. The step of removing the wafer involves handling, which may precipitate occurrences of ESD. Occasionally, handling by a person is not necessary to release the ESD. If the photolithographic device improperly grounds the wafer (e.g., a grounding pad does not function properly), ESD can occur without human contact.

A completed wafer may consist of several IC chips which need to be separated from the wafer for testing. At step 45, the individual IC chips are separated, inspected, and prepared for testing. Because of the handling and physical contact that may result from separating the IC chips, the wafer may be inspected after separation to detect an ESD potential during separation or for the entire process. At step 46, the individual IC chips are tested for functionality. An IC chip that passes this test may proceed to packaging and shipping at step 48, which still may pose a source of ESD for the IC chip. However, if the IC chip fails the functionality test, the chip is discarded at step 50.

Although not expressly shown in the figures, the wafer may include a test wafer comprising a chrome on quartz wafer or any other type of test wafer suitable for use in a manufacturing process. These test wafers may be utilized expressly for the purpose of determining sources of ESD in a particular manufacturing process or a combination of processes.

Given the various procedures associated with manufacturing of semiconductors, various sources of ESD may cause a problem to wafers during any stage of the manufacturing process. In certain embodiments, the method allows for independent ESD testing at each step of the process or for collective ESD testing in any selected portion of the process. Both kinds of testing are helpful to identify and monitor ESD effects associated with semiconductor manufacturing. However, it should be noted that it is not necessary to perform an inspection of the wafer after each step of the manufacturing process, the inspection may take place after the completion of any step, such as the removal of the wafer from the patterning process.

Figure 4A:
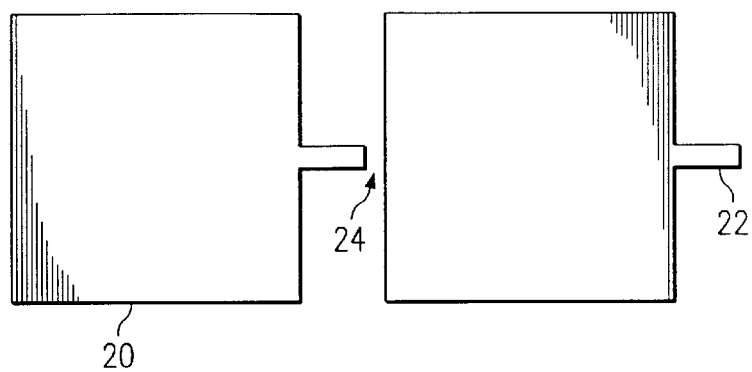
FIGS. 4A, 4B, and 4C illustrate inspection results indicating various degrees of electrostatic discharge effects on one embodiment of an apparatus incorporating the teachings of the present invention.
Figure 4B:
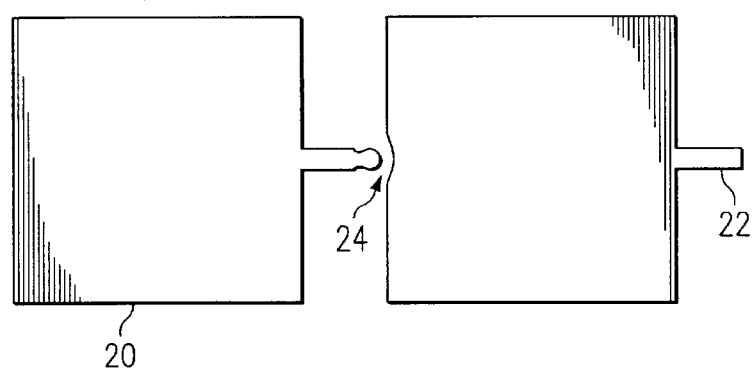
Figure 4C:
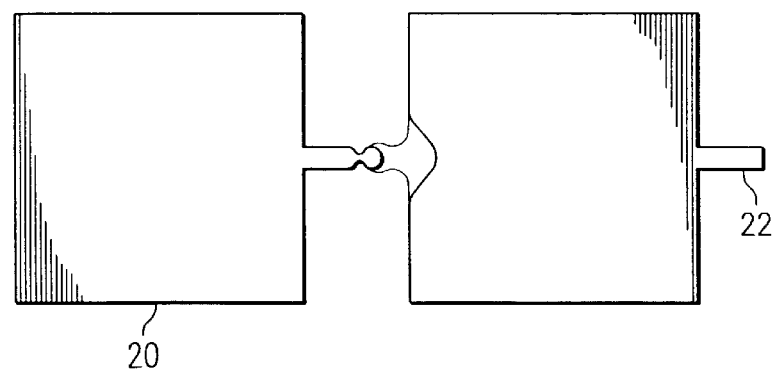

FIGS. 4A, 4B and 4C illustrate inspection results indicating various degrees of electrostatic discharge effects on one embodiment of apparatus 10. The most common ESD effects on wafers include material sputtering and material migration, which can cause a change of electrical properties. Basically, material sputtering occurs where the conductive layer that forms a geometry on a wafer has been deposited where it should not be. Missing portions of the conductive layer is a more common effect of material migration. Material migration is usually more devastating to the functionality of an IC device. Because the effects of material migration may be cumulative, the potential for damage to the IC chip may be high.

However, material sputtering can also cause functionality failure of an IC device. Material sputtering usually occurs between conductive features formed on the semiconductor wafer. Typically, material sputtering appears where the conductive features are approximately ten microns apart, which is approximately equal to the scatter free distance for electrons in air. Thus, a potential exists for ESD effects to damage the functionality of the IC chip.

As illustrated in FIG. 4A, there is limited if any visible effect from ESD. As ESD effects begin to appear, there may be slight material sputtering and migration at a point of highest ESD potential. As illustrated in FIG. 4B, the point of highest ESD potential occurs at gap 24 formed between line 22 and body 20 of ESD sensitive geometry 16. In this particular illustration, line 22 has some material sputtering at the indented portions near the end of line 22. Also, there are some instances of material sputtering on body 20 shape nearest gap 24. Additionally, material migration is present on the end of line 22 as illustrated by the rounded tip on line 22. As the effects of the ESD become apparent, the effects of material migration have caused a bridge of material from line 22 to body 20, as illustrated in FIG. 4C. This effect of material migration may cause the IC chip to be non-functional. Although not expressly shown, material sputtering may cause a break in the feature on a wafer and also cause the IC chip to become non-functional.

While material sputtering and material migration may cause non-functionality in an IC chip, the effects may be predicted through the use of ESD sensitive geometry 16. Because apparatus 10 is extremely sensitive to ESD effects, it will yield ESD defects that may not be present on the formed electrical circuit pathways. In fact, the high sensitivity provided allows the features on the test wafer to reveal ESD effects in one or more cycles of exposure to a given manufacturing procedure or piece of equipment. As opposed an IC design geometry, the IC geometry may not reveal similar effects until after hundreds or thousands of exposures to an ESD event.

Moreover, ESD sensitive geometry 16 of apparatus 10 may be designed to correspond with any design rule used by the IC manufacturer. When dealing with extremely small design rules, ESD effects may be exaggerated (i.e., defects affecting device functionality will more readily occur). In certain embodiments, a manufacturer may quickly determine how small and how consistently the manufacturer may produce IC devices with its current system without ESD effects. The number of modules which generate the high sensitivity to ESD effects, may provide a scale to measure the relative change of ESD risk. A calibration of this scale is in preparation. In some embodiments, this scale may be calibrated.

Additionally, given the ease and relatively low costs of monitoring and evaluating the test wafer, a user can narrowly test a single aspect or procedure of its manufacturing process. Alternatively, the user can test the entire process for cumulative ESD effects. This capacity allows the manufacturer to monitor its procedures and to identify ESD problem areas.

Although the present invention has been described in detail, it should be understood that various changes, substitutions and alterations can be made thereto without departing from the sphere and scope of the invention as defined by the appended claims.

What is claimed is:

1. A method for investigating electrostatic discharge (ESD) induced wafer defects, comprising:
    exposing a test wafer that includes an ESD sensitive risk scale geometry formed thereon to a semiconductor manufacturing procedure; and
    analyzing the test wafer using the ESD sensitive risk scale geometry to identify and evaluate severity of ESD effects associated with the semiconductor manufacturing procedure.

2. The method of claim 1, wherein the semiconductor manufacturing procedure comprises at least one procedure associated with manufacture of a wafer.

3. The method of claim 1, wherein the semiconductor manufacturing procedure comprises at least one procedure associated with photolithography.

4. The method of claim 1, wherein the semiconductor manufacturing procedure comprises at least one procedure associated with testing a photolithographic tool.

5. The method of claim 1, wherein the semiconductor manufacturing procedure comprises storing a wafer.

6. The method of claim 1, wherein the semiconductor manufacturing procedure comprises cleaning a wafer.

7. The method of claim 1, wherein the semiconductor manufacturing procedure comprises handling a wafer.

8. The method of claim 1, wherein the semiconductor manufacturing procedure comprises placing a wafer in a photolithographic process.

9. The method of claim 1, wherein analyzing the test wafer further comprises observing a wafer under a microscope.

10. The method of claim 1, wherein analyzing the test wafer further comprises observing the test wafer with an optical inspection device operable to show differences in optical behavior of metal associated with a metal layer of the test wafer.

11. The method of claim 1, wherein the electrostatic discharge effects comprise material migration.

12. The method of claim 1, wherein the electrostatic discharge effects comprise material sputtering.

13. The method of claim 1, wherein the ESD sensitive risk scale geometry comprises one or more design rules in a semiconductor manufacturing process.

14. The method of claim 1, wherein determining the electrostatic discharge effects comprises identifying a minimum design rule to which the semiconductor manufacturing procedure satisfactorily manufactures an integrated circuit device.

15. The method of claim 1, further comprising analyzing a portion of the ESD sensitive risk scale geometry including a gap width of approximately 0.15 microns and a line width of approximately 0.25 microns to evaluate satisfactory manufacture to a 0.15 microns design rule.

16. The method of claim 1, further comprising analyzing the ESD sensitive risk scale geometry including a gap width of approximately 0.25 microns and a line width of approximately 0.25 microns to evaluate satisfactory manufacture to a 0.25 microns design rule.

17. A method for monitoring severity of electrostatic discharge effects, comprising:
    contacting a test wafer that includes an electrostatic discharge sensitive risk scale geometry formed thereon with a piece of semiconductor manufacturing equipment;
    removing the test wafer from the piece of semiconductor manufacturing equipment; and
    analyzing the test wafer using the risk scale geometry to determine severity of any electrostatic discharge effects associated with contact by the piece of semiconductor manufacturing equipment.

18. The method of claim 17, wherein the piece of semiconductor manufacturing equipment comprises a wafer storage device.

19. The method of claim 17, wherein the piece of semiconductor manufacturing equipment comprises a stepper.

20. The method of claim 17, further comprising creating a photolithographic image on the test wafer before analyzing the test wafer.

21. A wafer for monitoring electrostatic discharge effects associated with semiconductor manufacturing, comprising:
    a plurality of test modules formed on the wafer;
    a risk scale formed on each test module defined in part by an electrostatic discharge (ESD) sensitive geometry;
    the ESD sensitive geometry including at least one test module defined in part by at least two bodies;
    each body including a surface area sufficient to induce ESD effects; and
    a line and a gap disposed between the two bodies.

22. The wafer of claim 21, further comprising:
    the line extending from a first of the at least two bodies toward a second of the at least two bodies;
    the line including a terminal end proximate the second of the at least two bodies; and
    the terminal end defining the gap between the terminal end and the second of the at least two bodies.

23. The wafer of claim 21, further comprising the plurality of test modules arranged in a two-dimensional array.

24. An apparatus for monitoring electrostatic discharge effects associated with manufacture of an integrated circuit comprising:
- a plurality of test modules with each test module defined in part by a respective electrostatic discharge sensitive geometry;
- the geometry for each test module including at least two bodies;
- each body including sufficient surface area to accommodate an electrostatic discharge;
- a line extending from at least one of the two bodies toward a second of the at least two bodies;
- the line including a terminal end proximate the second body to define a gap between the terminal end and the second body; and
- the test modules cooperating with each other to provide an electrostatic discharge sensitive risk scale.

25. A method for manufacturing a test wafer including an electrostatic discharge (ESD) sensitive geometry formed thereon comprising:
- providing a wafer; and
- forming the ESD sensitive geometry on the wafer with risk scale operable to identify and evaluate severity of ESD effects associated with a manufacturing process.

26. The method of claim 25, further comprising forming the electrostatic discharge sensitive geometry with a plurality of bodies, lines and gaps.

27. The method of claim 25, further comprising forming the ESD sensitive geometry inside a scribe line of the wafer.

28. The method of claim 25, further comprising forming the ESD sensitive geometry inside an active area of the wafer.

* * * * *